United States Patent
Sinclair

(10) Patent No.: US 6,275,325 B1
(45) Date of Patent: Aug. 14, 2001

(54) THERMALLY ACTIVATED MICROELECTROMECHANICAL SYSTEMS ACTUATOR

(75) Inventor: Michael J. Sinclair, Kirkland, WA (US)

(73) Assignee: Microsoft Corporation, Redmond, WA (US)

(*) Notice: Subject to any disclaimer, the term of this patent is extended or adjusted under 35 U.S.C. 154(b) by 0 days.

(21) Appl. No.: 09/545,558

(22) Filed: Apr. 7, 2000

(51) Int. Cl.$^7$ .................................................. G02B 26/00
(52) U.S. Cl. .............................................. 359/291; 359/290
(58) Field of Search ................................... 359/223, 224, 359/290, 291, 813, 822

(56) References Cited

U.S. PATENT DOCUMENTS

| | | | |
|---|---|---|---|
| 5,867,297 | * | 2/1999 | Kiang et al. ........................ 359/198 |
| 6,020,216 | * | 2/2000 | Beratan et al. ....................... 438/54 |
| 6,084,206 | * | 7/2000 | Williamson et al. ................ 219/212 |
| 6,137,206 | * | 10/2000 | Hill ..................................... 310/306 |

* cited by examiner

*Primary Examiner*—Ricky Mack
(74) *Attorney, Agent, or Firm*—Ipsolon LLP

(57) ABSTRACT

A microelectrical mechanical system (MEMS) actuator having coupled members that undergo different amounts of thermal expansion is disclosed for moving micromechanical objects, such as a mirror, toward and away from a surface or a planar substrate. The actuator members are a first elongate member and a second elongate member that are coupled together at their respective distal ends. At their respective proximal ends, the members are mounted onto discrete electrical paths formed on the substrate. Thus, current applied to one electrical pathway is conducted along the first member to the second member, and to the other electrical path. The first member includes a metal conductor that provides a reduced resistivity for electrical current. Thus, when current is applied to the actuator, the second member generates more thermal energy due to its increased resistance and thereby thermally expands a greater amount than the first member. By thermally expanding the second member more than the first member, the distal ends of the first and second members are constrained to move away from the substrate. This movement is used to move a mirror out of the plane of the planar substrate. To accommodate the changing distance and angles between the actuator and the mirror, a sliding hinge is located between the actuator and the mirror.

24 Claims, 5 Drawing Sheets

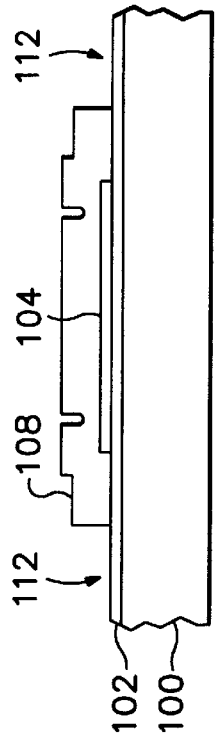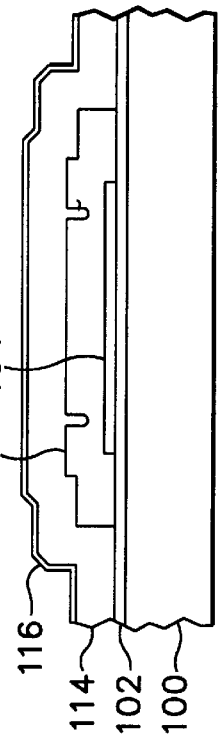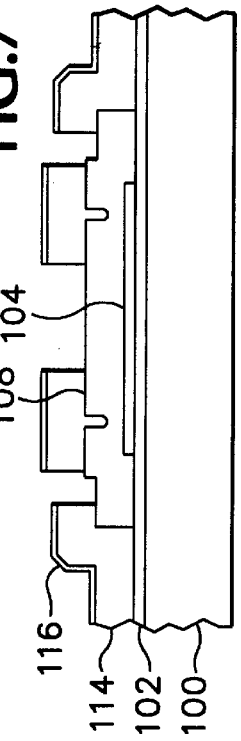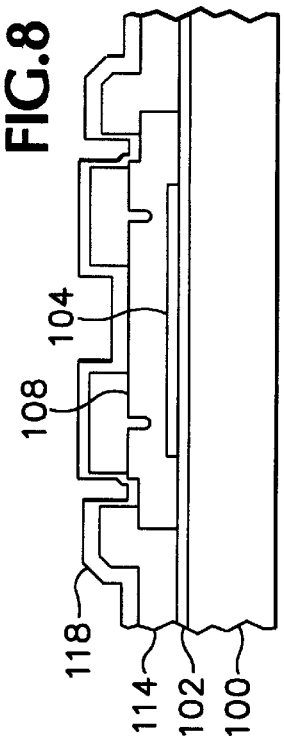
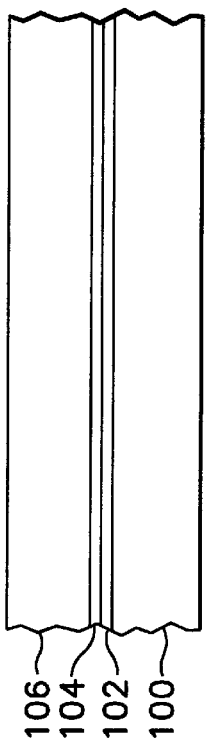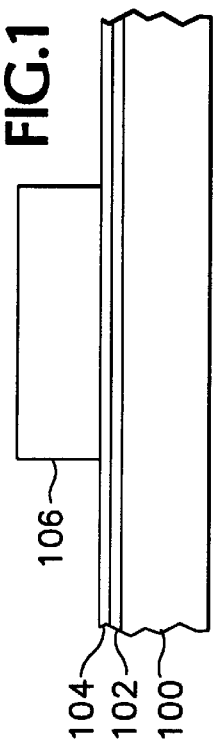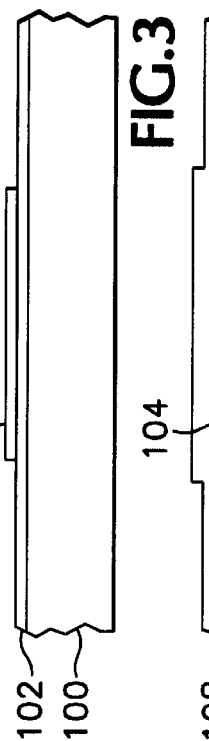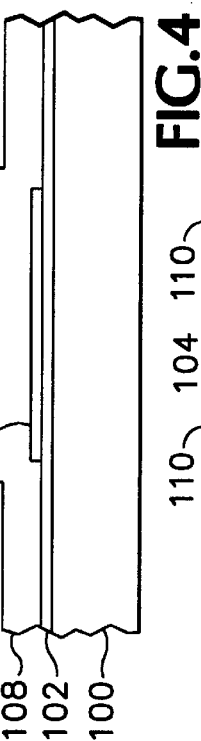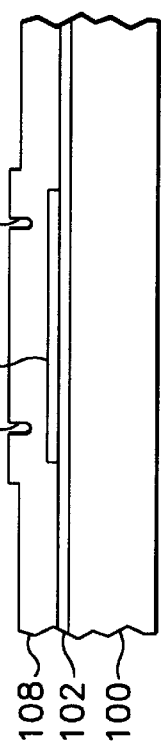

THERMALLY ACTIVATED MICROELECTROMECHANICAL SYSTEMS ACTUATOR

BACKGROUND OF THE INVENTION

1. Field of the Invention

This invention pertains to microelectromechanical systems (MEMS) actuators, and more particularly, this invention pertains to microelectromechanical systems actuators that use Joule heating to actuate the actuators.

2. Description of the Related Art

Electrically controlled actuators receive an electrical signal input and provide a mechanical output. The mechanical output is typically a force that is used to move objects. Large, electrically controlled actuators are common in mechanical systems to control valves, pumps, and move objects.

Recent innovations require control of very small components that are formed on semiconductor substrates by conventional semiconductor fabrication processes. In U.S. Pat. No. 5,808,384 a photolithographic process is used to fabricate a micromechanical actuator to control switches, relays, and valves. However, the invention of the 5,808,384 patent does not teach a means to move objects toward and away from the plane of the substrate upon which the device is formed.

A bimorph actuator has been formed on a planar substrate to use Joule heating to induce different rates of thermal expansion in different portions of the actuator thereby creating mechanical movement. This actuator has been limited to motion in the plane of the substrate, i.e., parallel to the substrate surface. Accordingly, such actuators can not be used to move an object toward, and away from, the plane of the substrate without using complicated mechanical linkages that convert motion in the plane of the substrate to motion out of the plane of the substrate.

In U.S. Pat. No. 5,867,297 the inventor discloses a microelectromechanical device to oscillate a mirror for deflecting a laser beam to read bar codes. The mirror is substantially upright and moved about a substratemounted hinge, but the device relies upon staples and hinges that are unreliable for repetitive motion. In addition, the mirror is hinged to the substrate and is therefore constrained to move in rotation about a single axis, thereby limiting its utility. Also, some applications require a mirror that is parallel to the substrate on which it is formed and that can move out of the plane of the substrate: a design limitation that can not be accommodated by the teachings of U.S. Pat. No. 5,867,297.

Currently, many applications seek to control a mirror surface to control light energy and move light beams in order to scan bar codes or create and project video images.

In U.S. Pat. No. 5,192,946 a spatial light modulator includes an array of mirrors that are used to create and project a video image onto a screen. The video image is created by directing light onto the mirror array (referred to in U.S. Pat. No. 5,192,946 as a deformable mirror device) and controlling an orientation of the individual mirrors in order to control a path of the light. The screen image comprises many pixel elements that correspond to individual mirrors in the array. Each pixel element is turned on and off by controlling the orientation of the mirrors to reflect the light toward the screen (through intermediate lenses) or away from the screen. The mirror array includes mirrors formed on a semiconductor substrate that are hinged to move between up and down positions in which the light is reflected toward or away from the screen in order to toggle on and off, respectively, the pixel element displayed on the screen. The individual hinged mirrors can only be rotated about one axis, providing only one degree of motion thereby limiting projector design. Also, the hinged motion of the mirrors of this reference is binary; that is, the mirrors are either fully rotated or fully unrotated and can not be partially rotated. Such video image systems are also referred to as digital light processors (DLP).

In order for such video systems to be viable, the mirror arrays must be easy and inexpensive to fabricate in quantity and provide controllable, high speed movement of the mirrors. Another important criteria is that the mirror actuation means be very reliable to withstand millions of actuations without failure. In many designs, semiconductor hinges have proven to have lower reliability than desired. In addition, it is desirable that the mirrors of the mirror array can be moved a sufficient range of motion along several axes of motion to accommodate projector designs. Accordingly, where other factors are equal, actuators that can move a mirror in 2 or 3 degrees of motion and with a range of motion of ±30 degrees about each axis of rotation is preferred to an actuator system that can move a mirror a maximum of ±10 degrees in only one degree of motion.

SUMMARY OF THE INVENTION

The present invention provides a substrate-mounted microelectromechanical systems actuator that receives electrical input and provides a mechanical output to controllably move an object along an axis that extends from a plane of the substrate. Such motion along an axis that extends from the plane of the substrate is known in the vernacular as motion out of the plane.

In a first preferred embodiment of an actuator of the present invention, electrical input is conducted along plural, elongate polysilicon actuator members that are mounted on a planar substrate. Different actuator members are provided with different resistivity so that Joule heating occurs at different rates in the members and the members undergo different amounts of thermal expansion.

The members are constrained to move out of the plane of the substrate on which they are formed by their arrangement. That is, the members are coupled to the substrate at proximal ends and the members are coupled together at distal ends. Thus, a potential voltage applied to respective proximal ends of the members creates a current that flows through both members and causes Joule heating in the members. Because the members have different rates of Joule heating, the same current in both members causes amounts of heating and different amounts of thermal expansion. As the members expand, the distal connection of the members constrains the members to move away from the substrate. A mirror, coupled to the distal ends of the members is thereby moved along an axis that extends from the plane of the substrate, i.e., out of the plane.

In a first embodiment, the resistivity among different members is made non-equal by providing a relatively low resistance metal conductor along one of the polysilicon members. Alternatively, the members may be provided with non-equal resistivity by differences in the members materials, metal coating, doping, or cross-sectional area. In further alternative embodiments, the resistivity of the members is substantially equal, but the members have different amounts of thermal expansion due to different physical configurations.

The preferred embodiment of the invention is shown in the context of supporting, and controllably moving, a mirror.

In this embodiment, the actuator members are fixedly coupled to the planar substrate at their proximal ends and fixedly coupled to each other at their distal ends which are cantilevered above the substrate. The mirror is suspended above, and substantially parallel to, the substrate by the actuators. Accordingly, when the actuator members undergo different amounts of thermal expansion, the members must deform to accommodate their connections and thereby tilt the mirror by moving a side of the mirror away from the plane of the substrate.

Preferably, the members are coupled to the mirror via a sliding hinge. Because of thermal expansion, the distance between the member's proximal ends (where they connect to the substrate) and the mirror increases during actuation. Thus, the sliding hinge must accommodate this change in distance, as well as a change in the angle, between the members and the mirror.

In alternative embodiments, the members are coupled to the mirror with a bendable structure, such as a polysilicon leaf spring. However, the bending structures require additional force to bend in addition to forces required to move the mirror.

Overview of the MUMPs Fabrication Process

To assist with understanding the present invention, the general procedure for fabricating micromechanical devices using the MUMPs process is explained with reference to FIGS. 1–15.

The MUMPs process provides three-layers of conformal polysilicon that are etched to create a desired physical structure. The first layer, designated POLY 0, is coupled to a supporting wafer, and the second and third layers, POLY 1 and POLY 2, respectively, are mechanical layers that can be separated from underlying structure by the use of sacrificial layers that separate layers and are removed during the process.

The accompanying figures show a general process for building a micro-motor as provided by the MEMS Technology Applications Center, 3021 Comwallis Road, Research Triangle Park, North Carolina.

The MUMPs process begins with a 100 mm n-type silicon wafer 100. The wafer surface is heavily doped with phosphorus in a standard diffusion furnace using POCl 3 as the dopant source. This reduces charge feed-through to the silicon from electrostatic devices subsequently mounted on the wafer. Next, a 600 nm low-stress Low Pressure Chemical Vapor Deposition (LPCVD) silicon nitride layer 102 is deposited on the silicon as an electrical isolation layer. The silicon wafer and silicon nitride layer form a substrate.

Next, a 500 nm LPCVD polysilicon film—POLY 0 104—is deposited onto the substrate. The POLY 0 layer 104 is then patterned by photolithography; a process that includes coating the POLY 0 layer with a photoresist 106, exposing the photoresist with a mask (not shown) and developing the exposed photoresist to create the desired etch mask for subsequent pattern transfer into the POLY 0 layer (FIG. 2). After patterning the photoresist, the POLY 0 layer 104 is etched in an Reactive Ion Etch (RIE) system (FIG. 3).

With reference to FIG. 4, a 2.0 $\mu$m phosphosilicate glass (PSG) sacrificial layer 108 is deposited by LPCVD onto the POLY 0 layer 104 and exposed portions of the nitride layer 102. This PSG layer, referred to herein as a First Oxide, is removed at the end of the process to free the first mechanical layer of polysilicon, POLY 1 (described below) from its underlying structure; namely, POLY 0 and the silicon nitride layers. This sacrificial layer is lithographically patterned with a DIMPLES mask to form dimples 110 in the First Oxide layer by RIE (FIG. 5) at a depth of 750 nm. The wafer is then patterned with a third mask layer, ANCHOR1, and etched (FIG. 6) to provide anchor holes 112 that extend through the First Oxide layer to the POLY 0 layer. The ANCHOR 1 holes will be filled in the next step by the POLY 1 layer 114.

After the ANCHOR1 etch, the first structural layer of polysilicon (POLY 1) 114 is deposited at a thickness of 2.0 $\mu$m. A thin 200 nm PSG layer 116 is then deposited over the POLY 1 layer 114 and the wafer is annealed (FIG. 7) to dope the POLY 1 layer with phosphorus from the PSG layers. The anneal also reduces stresses in the POLY 1 layer. The POLY 1 and PSG masking layers 114, 116 are lithographically patterned to form the structure of the POLY 1 layer. After etching the POLY 1 layer (FIG. 8), the photoresist is stripped and the remaining oxide mask is removed by RIE.

After the POLY 1 layer 114 is etched, a second PSG layer (hereinafter "Second Oxide") 118 is deposited (FIG. 9). The Second Oxide is patterned using two different etch masks with different objectives.

First, a POLY1_POLY2_VIA etch (depicted at 120) provides for etch holes in the Second Oxide down to the POLY 1 layer 114. This etch provide a mechanical and electrical connection between the POLY 1 layer and a subsequent POLY 2 layer. The POLY1_POLY2_VIA layer is lithographically patterned and etched by RIE (FIG. 10).

Second, an ANCHOR2 etch (depicted at 122) is provided to etch both the First and Second Oxide layers 108, 118 and POLY 1 layer 114 in one step (FIG. 11). For the ANCHOR2 etch, the Second Oxide layer is lithographically patterned and etched by RIE in the same way as the POLY1_POLY2_VIA etch. FIG. 11 shows the wafer cross section after both POLY1_POLY2_VIA and ANCHOR2 etches have been completed.

A second structural layer, POLY 2, 124 is then deposited at a thickness of 1.5 $\mu$m, followed by a deposition of 200 nm of PSG. The wafer is then annealed to dope the POLY 2 layer and reduce its residual film stresses. Next, the POLY 2 layer is lithographically patterned with a seventh mask and the PSG and POLY 2 layers are etched by RIE. The photoresist can then be stripped and the masking oxide is removed (FIG. 13).

The final deposited layer in the MUMPs process is a 0.5 $\mu$m metal layer 126 that provides for probing, bonding, electrical routing and highly reflective mirror surfaces. The wafer is patterned lithographically with the eighth mask and the metal is deposited and patterned using a lift-off technique. The final, unreleased exemplary structure is shown in FIG. 14.

Lastly, the wafers undergo sacrificial release and test using known methods. FIG. 15 shows the device after the sacrificial oxides have been released.

In preferred embodiments, the device of the present invention is fabricated by the MUMPs process in accordance with the steps described above. However, the device of the present invention does not employ the specific masks shown in the general process of FIGS. 1–15, but rather employs masks specific to the structure of the present invention. Also, the steps described above for the MUMPs process may change as dictated by the MEMS Technology Applications Center. The fabrication process is not a part of the present invention and is only one of several processes that can be used to make the present invention.

BRIEF DESCRIPTION OF THE DRAWINGS

FIGS. 1–15 are cross-section views of a general multi-user MEMS process known in the prior art for fabricating microelectrical mechanical devices. Cross-hatching is omitted to improve clarity of the prior art structure and process depicted.

DESCRIPTION OF THE PREFERRED EMBODIMENTS

Figure 10:
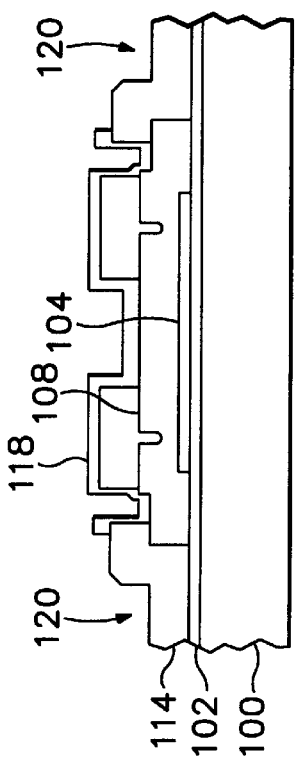
Figure 11:
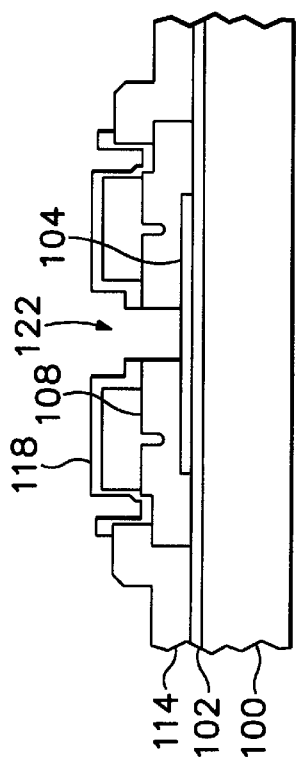
Figure 12:
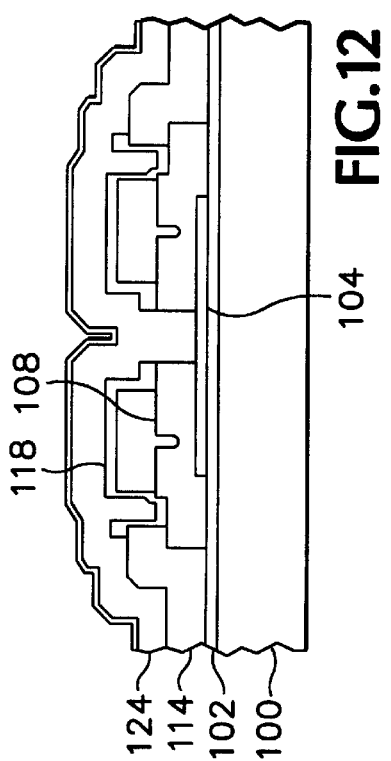
Figure 13:
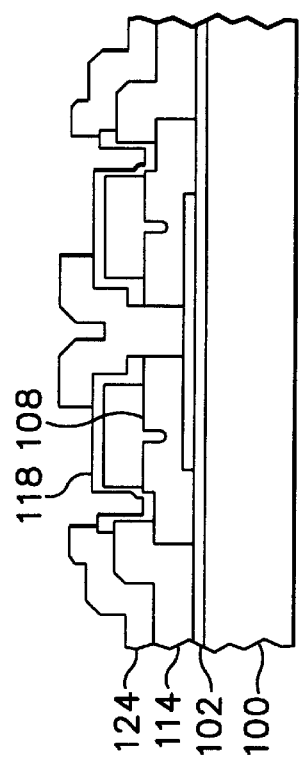
Figure 14:
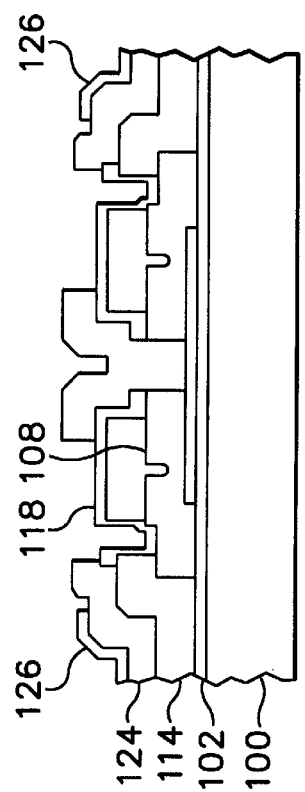
Figure 15:
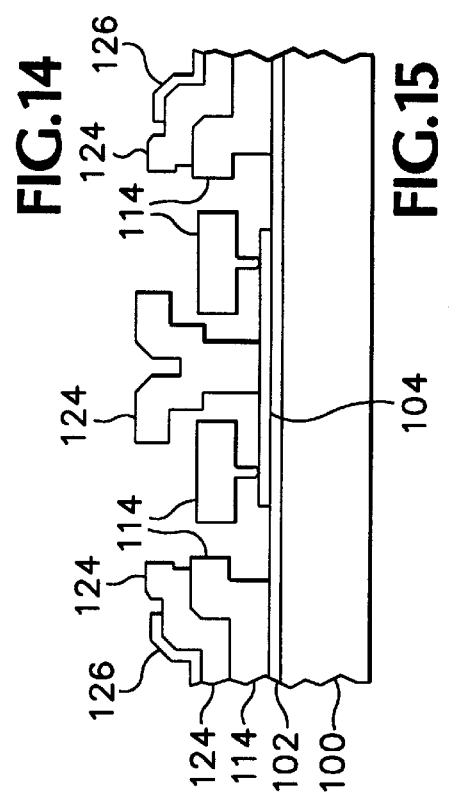
Figure 16:
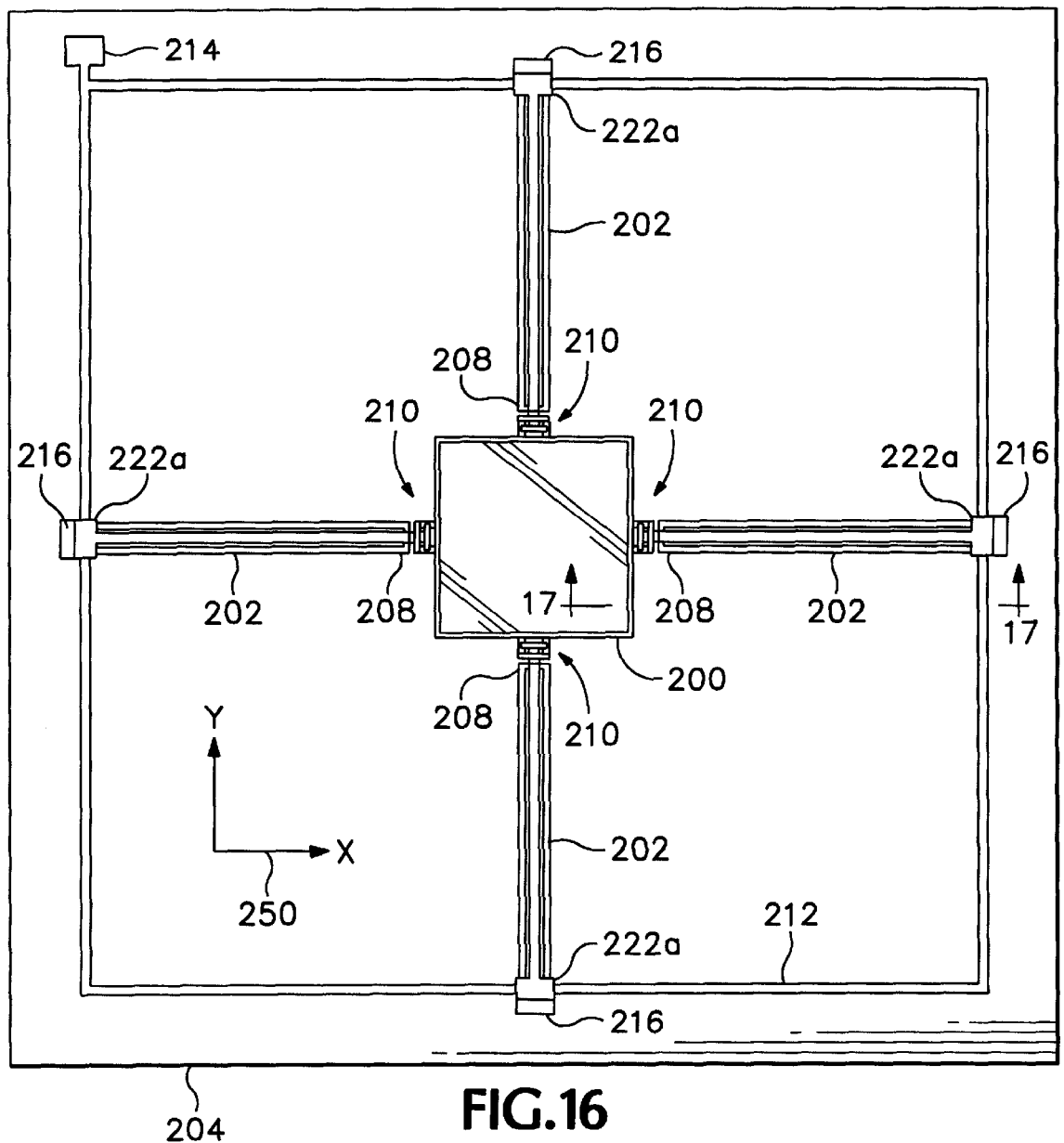
FIG. 16 is a top plan view of a microelectrical mechanical device having a mirror and a preferred embodiment of four actuators of the present invention coupled to the mirror for moving the mirror.

A preferred embodiment of the present invention is described below with reference to the accompanying FIGS. 16–20. Parts of the description of the preferred embodiment refer to steps of the MUMPs fabrication process described above. However, as stated, MUMPs is a general fabrication process that accommodates a wide range of MEMS device designs. Consequently, a fabrication process that is specifically designed for the present invention will likely include different steps, additional steps, different dimensions and thickness, and different materials. Such specific fabrication processes are within the ken of persons skilled in the art of photolithographic processes and are not a part of the present invention.

The present invention provides an electrically controlled actuator. While the present actuator is shown controlling a mirror surface—a common application of microelectrical mechanical actuators—the actuator may be used to control other physical structures, such as lenses, valves, and switches.

In the present invention, electrical input is provided to semiconductor members that change temperature in response to the conduction of electricity and the electrical resistance of the semiconductor—a phenomena known as Joule heating. In response to the change in temperature, the semiconductor members thermally expand in a predictable and controllable manner. The thermal expansion provides mechanical motion that can be mechanically leveraged to provide a desired throw, i.e., an amount of movement, out of the plane of the substrate.

While preferred embodiments of the present invention incorporate specific physical members having a coupled relationship, the present invention may be incorporated into other configurations having greater or fewer members coupled in different configurations.

Mirror Actuation System

In a first preferred embodiment of the invention, a mirror 200 is suspended above a planar substrate 204 by four actuators 202. Each actuator is anchored to the planar substrate 204 and extends over the substrate in a cantilever fashion. A sliding hinge 210 couples each actuator to a margin of the mirror in order to permit the mirror to tilt relative to the actuators, and to permit the distance between the mirror and actuator ends 208 to increase, without decoupling from, or causing a stress in, the actuators or mirrors.

An electrical conduit 212 is located on the substrate 204 that electrically connects a portion of each actuator 202 and to a common pad 214. Another portion of each actuator is electrically coupled to a respective input pad 216.

In operation, electrical current is applied to one or more input pads 216 to create a voltage potential difference between the respective input pad 216 and the common pad 214 so that current passes through the actuators 202 to the conduit 212 and to the common pad 214. As current passes through the actuator, Joule heating occurs and the actuator deforms so as to move the actuator end 208 along an axis that extends out of the plane of the substrate, thus providing motion out of the plane of the substrate. The structure and operation of the actuator is explained in greater detail below.

As an actuator moves out of the plane of the substrate, its connection to the mirror forces the mirror to move out of the substrate plane. The sliding hinges 210 permit the mirror to move in and out of the plane of the substrate and remain coupled to the actuators even though the distance between fixed ends of the actuators and the mirror changes.

By controlling one actuator, the mirror can be simply tilted. Two or more actuators may also be controlled to tilt the mirror about an axis, as may be desired for a particular application. When all actuators are used, the mirror may be moved away from the substrate and kept parallel to the plane of the substrate.

The embodiment shown in the accompanying figures depicts the actuators 202 arranged radially outward from the mirror 200. In alternative embodiments, the actuators may be arranged as the spokes of a bicycle wheel that are tangent to a central hub. That is, a first actuator would be parallel, and coupled, to a first margin of the mirror, a second actuator would be parallel, and coupled, to a second margin of the mirror, and so on.

Additionally, if the device is fabricated by a fabrication process other than MUMPS, the actuators 202 may be arranged to pass beneath the mirror 200. Exemplarily, an actuator would be anchored to the substrate beneath a first margin of the mirror and would extend under the mirror to couple to an opposed margin of the mirror. Such alternative embodiments, may permit closer spacing of multiple mirrors 200, which may be desirable so as to build an array of closely-spaced mirrors.

Actuator Structure

Figure 17:
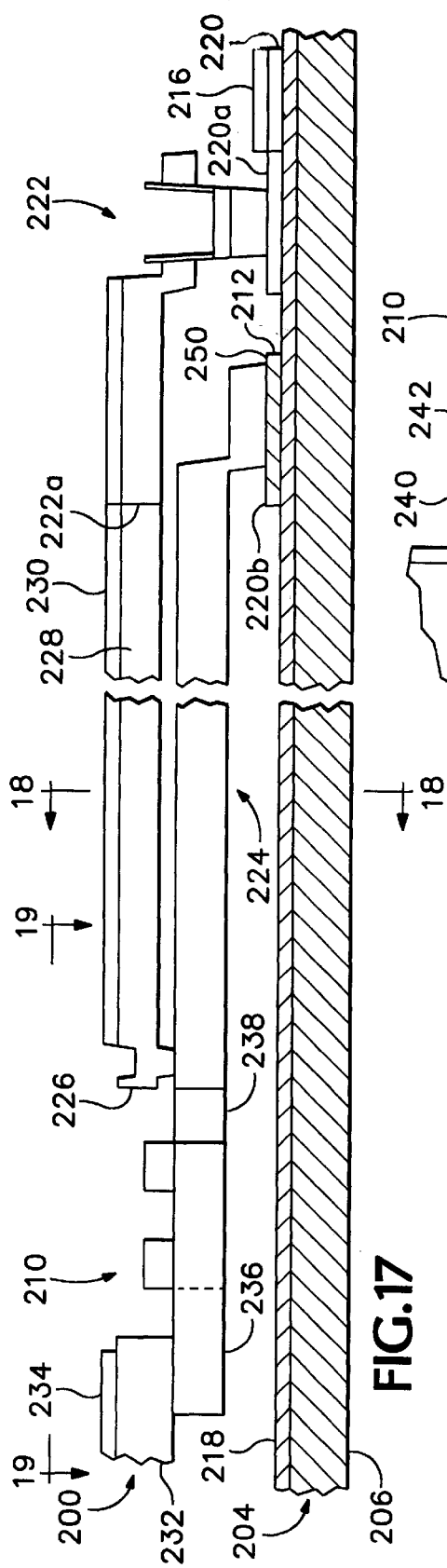
FIG. 17 is an enlarged, partial cross-section view of a preferred embodiment of an actuator of the present invention as seen along the line 17—17 of FIG. 16.
Figure 18:
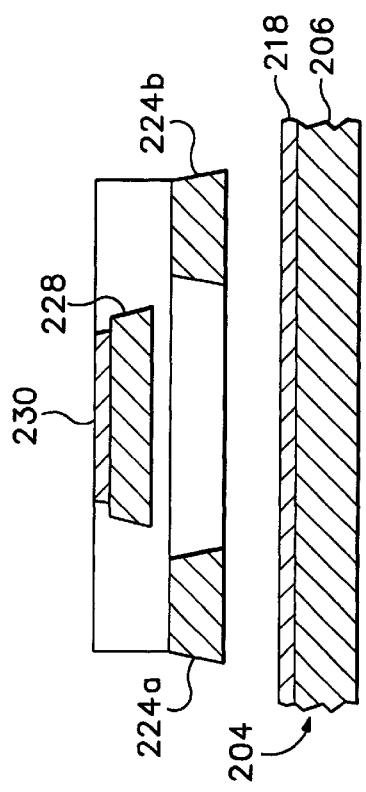
FIG. 18 is an enlarged, partial cross-section view of the actuator of FIG. 17 as viewed along line 18—18 of FIG. 17.

With particular reference to FIGS. 17 and 18, a preferred embodiment of the actuators 202 is described. The actuators are located on the substrate 204, which includes a silicon wafer 206 and a nitride layer 218. The nitride layer provides electrical insulation so that substrate-mounted structures that are physically separated are also electrically isolated. Thus, conduit 212 and common pad 214 are electrically isolated from input pad 216. When an electric potential is provided across input pad 216 and common pad 214, current can not be conducted along the nitride layer or the silicon wafer. Rather, such current must be conducted along conductive members of the actuators and conduit 212.

On top of the nitride layer, the POLY 0 layer is deposited to form a first polysilicon layer 220 having first and second pads 220a and 220b. The first pad 220a of the Poly 0 layer extends outward to form a connection for the input pad 216. The second pad 220b forms a portion of the electrical conduit 212.

Anchored onto the first pad 220a is a first actuator member 222 and anchored onto the second pad 220b is a second actuator member 224. These first and second members are physically and electrically coupled together at a distal end 226 of the first member. The second member 224 extends beyond the first member 222 and provides structure that forms a part of the sliding hinge 210 (described in greater detailed below).

The first member 222 includes a semiconductor leg 228 having a metal layer 230 thereon. The metal layer 230 reduces the electrical resistivity of the first member 222. Because Joule heating is equal to the current squared times resistance ($i^2R$), the low resistance metal layer reduces the amount of Joule heating that occurs in the first member. And, reduced Joule heating means that the first member will undergo less thermal expansion for a given current than a similarly arranged and constructed member having a higher electrical resistance.

The second member 224 includes two elongate legs 224a and 224b that are arranged substantially parallel and spaced-apart. Each leg of the second member 224 is anchored to the pad 220b, which pad is a portion of the common conduit 212. The legs 224a and 224b of the second member are spaced-apart and located outboard of the first member 222. By providing the second member as two spaced-apart legs that are located outboard of the first member 222, heat in the second member is more quickly dissipated. Quick heat dissipation is desirable in order to gain greater control and speed over thermal expansion and cooling of the second member.

Ideally, current flow through the actuator members 222, 224 would generate Joule heating causing instant thermal expansion, and an absence of current flow would stop generation of Joule heating and heat energy in the members would instantaneously dissipate causing instant thermal contraction back to a normal state. While the ideal of instant thermal expansion and contraction is not possible, the preferred geometry of the first and second members facilitates efficient heat dissipation providing greater control of actuator motion.

The second member 224 does not include a metal layer and thus has relatively higher resistivity as compared to the first member 222. Accordingly, a current passing through the first and second members will generate more thermal energy in the second member than in the first member, and the second member will undergo greater thermal expansion. In actuators of the present invention, the first member 222, having the metal conductor thereon, had a resistance of approximately 2 Ω and the second member had a resistance of approximately 200 Ω.

Figure 20:
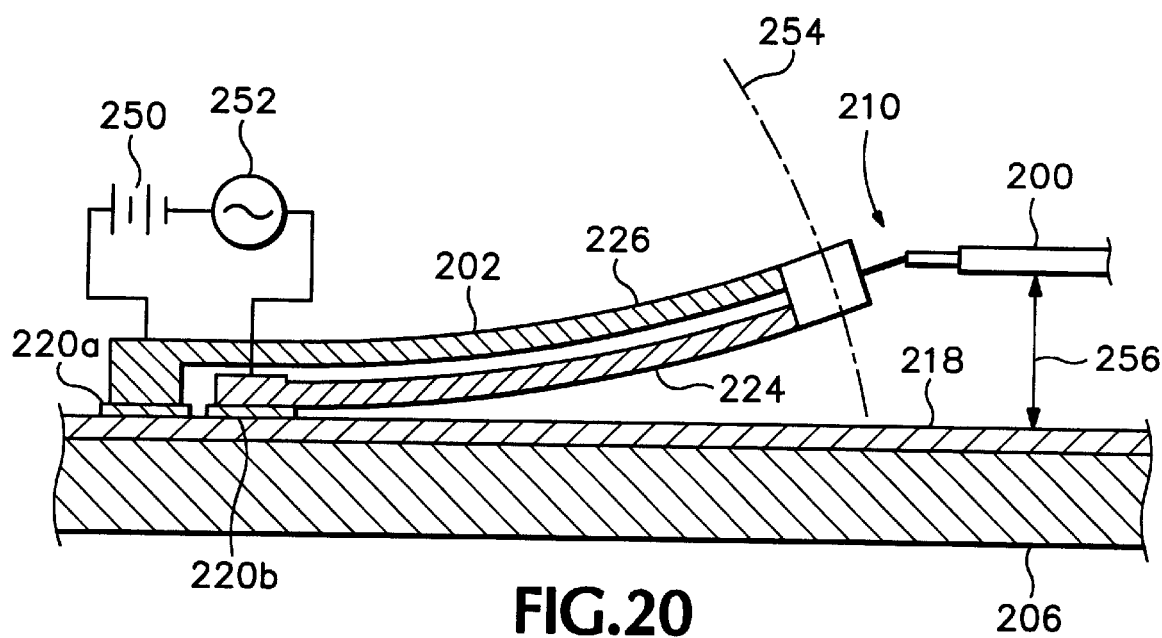
FIG. 20 is a schematic representation of the actuator of the present invention coupled to two current sources for activating the actuator.

Because the first and second members are coupled at the distal end 226 and thus conduct equal current for a given potential, and because the first and second members have different electrical resistivity, the first and second members will undergo different amounts of thermal expansion. Because the distal ends are fixedly coupled, and the second member undergoes more thermal expansion than the first member, distal ends of the actuator are constrained to move "upward," out of the plane of the substrate. The members thus flex along their length, as is schematically represented in FIG. 20.

The members are fixed to the substrate at the respective pads 220a and 220b and the flexing due to constrained thermal expansion initiates proximate the fixed ends. Preferably, the flexing of the first and second members occurs about an axis that is parallel to the substrate and orthogonal to the elongate axis of the first and second members, which causes the distal ends to deflect up. The point of onset of flexing of the first member is controlled by extending a flex control head 222a over the fixed end of the second member above the pad 220b.

As stated, the actuators and mirror assembly of the present invention are preferably fabricated by the MUMPS process. With reference to the terms defined in connection in the above description of the MUMPS process, elements of the present invention are now correlated with the MUMPS fabrication process.

The POLY 0 layer forms the common conduit 212 and pads 220 and 214. The POLY 1 layer forms the second member 224 of the actuators 202, which member is anchored to the pad portion 220b of the common conduit 212. The POLY 1 layer also forms a portion of the sliding hinge 210.

On top of the POLY 1 layer, the Second Oxide layer is deposited, and the two different etch masks are executed. In the present invention, the POLY1_POLY2_VIA etch is used to connect the first member 222 to the second member 224 at the distal end 226 of the first member. The POLY1_POLY2_VIA etch is also used to couple portions of the sliding hinge. The ANCHOR 2 etch is used to etch through the First and Second Oxide layers to anchor the POLY 2 layer to the POLY 0 layer at the pad 220a.

After the POLY1_POLY2_VIA and ANCHOR 2 etches, the POLY 2 layer is deposited and etched to form the first member 222, a planar surface 232 of the mirror, and portions of the sliding hinge 210. Thereafter, a thin metal layer is deposited on top of the POLY 2 layer to form the first member's metal layer 230 and onto the planar surface 232 to create a polished surface 234 for the mirror. The metal layer is also deposited at the pads 214 and 216 to provide suitable probe or wire bonding surfaces. The process is completed by release and removal of the sacrificial oxide layers.

In alternative embodiments of the invention, the second member 224 may comprise a single leg or more than two legs. The second member may be substantially similar to the first member 222 so long as the second and first members undergo different amounts of thermal expansion in response to a current flowing through the first and second members and sufficient heat dissipation occurs to permit the members to rapidly thermally contract. The first and second members may be forced to have different amounts of thermal expansion by providing different resistivity between the first and second members, different materials having different coefficients of linear expansion, and different shapes that exchange heat with their environment differently.

Sliding Hinges

The sliding hinge 210 provides a connection between the actuators and the mirror that allows the mirror to move without stressing the members. Because the distance between the location where the members are anchored to the substrate, and the mirror margin, changes as the actuators move, it is desired to have a coupler that accommodates the change in distance. Additionally, as the mirror moves, an angular relationship between the mirror and the actuators changes. Thus, it is desirable to have a coupler between the actuators and the mirror that simultaneously accommodates the change in distance and the change in angle.

Figure 19:
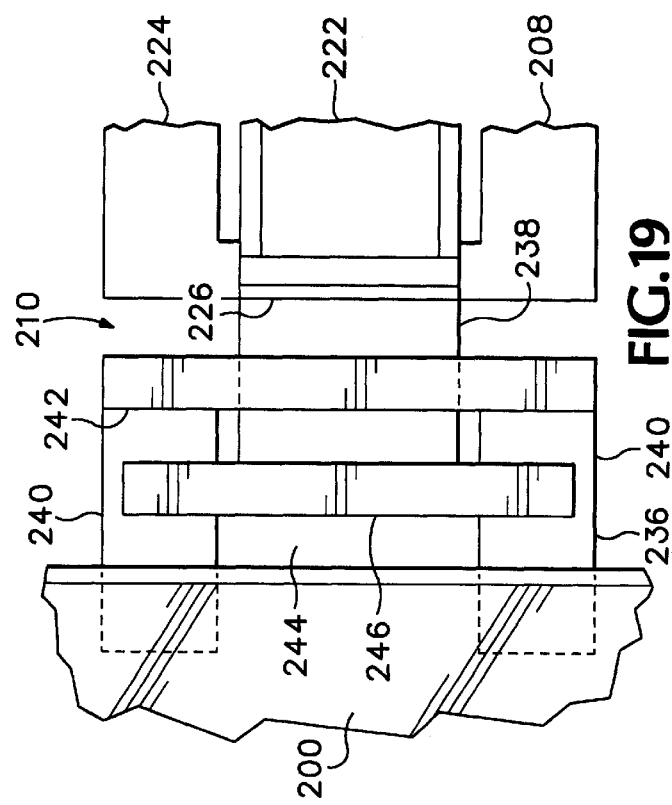
FIG. 19 is a partial, enlarged top plan view showing a preferred embodiment of a sliding hinge of the present invention as seen along line 19—19 of FIG. 17.

With particular reference to FIGS. 17 and 19, a preferred embodiment of the sliding coupler is described. The sliding coupler includes a yoke 236 and an elongate tenon 238. The yoke is fixedly coupled to a margin of the mirror 200 and extends outward therefrom. The yoke includes spaced-apart carrying beams 240 and a stop beam 242 that is located atop, and between, the carrying beams. Between the carrying beams 240 is a channel 244.

The tenon 238 has an elongate stock 246 that is arranged on top of the tenon and substantially transverse to the tenon. The tenon is located so as to extend into the channel 244 and the stock is on top of the carrying beams 240 and substantially parallel to the stop beam 242. Thus, the tenon can slide along its longitudinal axis within the channel between the mirror margin and the stop beam 242. The tenon is prevented from escaping from the channel by the stock and the stop beam.

Preferably, the carrying beams 240 and the tenon 238 are formed as part of the POLY 1 layer and the POLY1_POLY2_VIA etch forms openings through the Second Oxide layer for the stock 246 and the stop beam 242. The stock and stop beam are then formed as part of the POLY 2 layer and connect to the tenon and carrying beams, respectively, through the openings formed by the POLY1_POLY2_VIA etch.

Operation

A preferred embodiment of the operation of the present invention is discussed with reference to FIG. 20, which schematically depicts a single actuator 202 coupled to constant voltage supply 250 and variable voltage supply 252. (Although FIG. 20 depicts separate voltage supplies, the present invention can be operated with a single electrical energy supply that provides a base current equivalent to the output or the constant voltage supply and a variable current equivalent to the output of the variable voltage supply 252.)

Both voltage supplies 250, 252 are coupled so as to cause current flow through the actuator members 222 and 224 by creating a voltage potential across the respective pads 220a and 220b. Current thus flows along the length of one member to the distal end 226 and thence to the other member and back along that other member establishing a current path through the members. Current flow through the members creates Joule heating thereby increasing the thermal energy in the actuator members, which thermal energy causes the members to thermally expand.

The second member 224 has greater resistance to current than the first member 222 and hence the current generates more thermal heating in the second member so that the second member undergoes more thermal expansion. Because the distal ends of the actuator members are coupled, and the second member 224 expands more than the first member 222, the thermal expansion is constrained to move along a path 254 that extends from the plane of the substrate as schematically depicted in FIG. 20.

Preferably, a steady-state voltage supply is provided by constant voltage supply 250 to elevate the mirror to a working height 256. When the actuators and mirror of the present invention are fabricated, the mirror is located close to the substrate. Such closeness of the mirror and substrate restricts an amount of angular movement of the mirror before a margin of the mirror contacts the substrate. Accordingly, by providing an elevating current, the mirror is suspended further above the substrate thereby permitting a greater amount of angular movement of the mirror before the mirror contacts the substrate.

The variable voltage supply 252 provides a controllable voltage to control an amount of movement of the actuator. A greater voltage provides proportionately more current, thereby generating more Joule heating. Thus, control of the variable voltage supply permits control of the actuators and control of movement of the mirror.

In practice, current is applied to an input pad 216 and is conducted to the first member 222 by the pad 220a. The current then is conducted along the members 222 and 224 to the second pad 220b which is electrically coupled to the common pad 214 by the conduit 212.

Because of the constraints wherein the actuator members are coupled at the distal end 226, the distal end must move upward, away from the substrate 204 when the second member thermally expands more than the first member. As the distal end moves upward, the tenon 238 also moves upward. The upward movement of the tenon is resisted by the stop beam 242 so that the entire sliding hinge is thus moved upward, and so too is the margin of the mirror 200.

When the current is reduced, Joule heating decreases and the thermal energy is dissipated. As the thermal energy dissipates, the members thermally contract and the distal end 226 moves downward, moving the tenon 238 downward. Downward motion of the tenon causes the stock 246 to push against the carrying beams 240 thereby pushing the mirror downward to its working position, wherein the elevating current maintains the mirror a preferred distance above the substrate.

The preferred embodiment of the present invention also provides the mirror 200 with two degrees of freedom. Assigning a Cartesian coordinate system 250 (FIG. 16) to the planar surface of the substrate, it is seen that the mirror may be rotated about the X and Y axes, in both the positive and negative directions of rotation. Additionally, the mirror may be rotated about the X and Y axes simultaneously. Accordingly, the present invention provides substantial control over the mirror's movement.

This specification sets forth the best mode for carrying out the invention as known at the time of filing the patent application and provides sufficient information to enable a person skilled in the art to make and use the invention. The specification further describes materials, shapes, configurations and arrangements of parts for making and using the invention. However, it is intended that the scope of the invention shall be limited only by the language of the claims and the law of the land as pertains to valid patents.

What is claimed is:

1. A microelectrical mechanical actuator, comprising:
   (a) a planar substrate;
   (b) a first member having first and second ends and wherein the first end of the first member is coupled to the substrate and the first member has a first electrical conductivity;
   (c) a second member having first and second ends and wherein the first end of the second member is coupled to the substrate and the second ends of the first and second member are coupled together and the second member has a second electrical conductivity; and
   (d) wherein electrical current is conducted along the first member and the second member causing thermal expansion of the first and second members and the first and second members expand at different rates thereby causing the second ends of the members to move away from the substrate.

2. The microelectrical mechanical actuator of claim 1 wherein the first member includes a conductor material and a semiconductor material.

3. The microelectrical mechanical actuator of claim 1 wherein the first member includes a low resistivity layer coupled thereto along a length thereof.

4. The microelectrical mechanical actuator of claim 1 further comprising a first source of electrical energy and a second source of electrical energy wherein the first source of electrical energy provides a first current to the actuator so as to move the second ends of the members to a first position away from the substrate and the second source of electrical energy provides a second current so as to move the second ends of the members to a second position away from the substrate.

5. The microelectrical mechanical actuator of claim 1 further comprising a source of electrical energy that provides a first current and a second current wherein the first current moves the second ends of the members a first distance away from the substrate and the second current moves the second ends of the members a second distance away from the substrate.

6. The microelectrical mechanical actuator of claim 1 further comprising a third member and wherein the third member is substantially similar to the second member and includes a first end coupled to the substrate and a second end coupled to the first member.

7. The microelectrical mechanical actuator of claim 6 wherein the first, second and third members are elongate and the second and third members are arranged laterally outboard of the first member.

8. The microelectrical mechanical actuator of claim 1 further comprising a sliding hinge having a shank and stock captured in a shackle.

9. The microelectrical mechanical actuator of claim 1 further comprising a sliding hinge coupled to the second end of the second member.

10. The microelectrical mechanical actuator of claim 1 further comprising an object that is moved by the actuator and a sliding hinge that is coupled to the object and the actuator that can change length and angle to accommodate motion of the object relative to the actuator.

11. A microelectrical mechanical actuator, comprising:
(a) a planar substrate;
(b) a first member having first and second ends and a first elongate portion located there between, wherein the first end is fixedly coupled to the substrate and the first elongate portion is arranged to extend over the substrate such that the longitudinal axis of the first elongate portion is substantially parallel to the plane of the substrate and is located a first distance above the substrate; and
(c) a second member having first and second ends and a second elongate portion located there between, wherein the first end is fixedly coupled to the substrate and the second elongate portion is arranged to extend over the substrate such that the longitudinal axis of the second elongate portion is substantially parallel to the plane of the substrate and is located a second distance above the substrate, and the second ends of the first and second members are coupled so that electrical current can flow through the first member to and through the second member;
(d) wherein the first distance of the first elongate portion is not equal to the second distance of the second elongate portion; and
(e) wherein Joule heating occurs when electrical current flows through the first and second members and the first member undergoes a first amount of thermal expansion, and the second member undergoes a second amount of thermal expansion that is not equal to the first amount of thermal expansion of the first member, so that the coupled second ends of the first and second members move relative to the substrate.

12. The microelectrical mechanical actuator of claim 11 wherein the second elongate portion comprises a first and second leg and the first leg is located proximate a first side of the first member and the second leg is located proximate a second side of the first member.

13. The microelectrical mechanical actuator of claim 11 wherein the second elongate portion comprises a first and second leg and the first leg is located proximate and outboard a first side of the first member and the second leg is located proximate and outboard a second side of the first member.

14. The microelectrical mechanical actuator of claim 11 wherein the second ends of the first and second members move along an axis that extends from the plane of the substrate when the first and second members undergo thermal expansion.

15. The microelectrical mechanical actuator of claim 11 wherein the first member includes a low electrical resistance layer so that an electrical resistance of the first member is less than an electrical resistance of the second member whereby less Joule heating occurs in the first member than the second member when current is conducted along the first and second members.

16. The microelectrical mechanical actuator of claim 11 wherein the first member comprises conductor material and semiconductor material.

17. An actuator device, comprising:
(a) a planar substrate;
(b) a first and a second actuator; and
(c) a mirror having a first margin coupled to the first actuator and a second margin coupled to the second actuator so as to locate a first portion of the mirror at a first distance from the substrate;
(d) wherein the first and second actuators each include first and second members having first ends that are fixedly arranged on the substrate and second ends that are electrically and fixedly coupled, whereby current can be selectively applied to the first or second actuator to cause thermal expansion of the actuator members that moves the first portion of the mirror from the first distance to a second distance from the substrate and the first and second distances are not equal.

18. The actuator device of claim 17 further comprising third and fourth actuators and wherein the third actuator is coupled to a third margin of the mirror and the fourth actuator is coupled to a fourth margin of the mirror and wherein the third and fourth actuators include first and second members having first ends that are fixedly arranged on the substrate and second ends that are electrically and fixedly coupled, whereby current can be selectively applied to the first, second, third, or fourth actuator to cause thermal expansion of the members that moves the first mirror portion from the first distance to the second distance.

19. The actuator device of claim 18 wherein the first and second actuators can cause the mirror to rotate about a first axis of rotation and the third and fourth actuators can cause the mirror to rotate about a second axis of rotation.

20. The actuator device of claim 17 wherein the mirror is substantially planar and when the first mirror portion is located at the first distance the mirror is substantially parallel to the substrate and when the first mirror portion is at the second distance the mirror is oblique to the substrate.

21. The actuator device of claim 17 wherein the first members of the first and second actuators include a conductor portion and a semiconductor portion.

22. The actuator device of claim 17 further comprising a source of electrical energy that can be selectively coupled to the first and second actuator, wherein the source of electrical energy provides an elevating current that moves the first mirror portion from the first distance to the second distance and a deflecting current that moves the first mirror portion from the second distance to a third distance.

23. The actuator device of claim 17 wherein the mirror is planar and the first and second actuators suspend the mirror in a first orientation that is substantially parallel to the substrate and spaced from the substrate by the first distance, and both actuators may be activated so as to move the mirror to a second orientation that is substantially parallel to the substrate and spaced from the substrate by the second distance.

24. The actuator device of claim 17 further comprising sliding hinges and wherein the first and second actuator are coupled to the mirror by the sliding hinges so that a distance and angle between the actuators and mirror can change when the first or second actuator is activated by applied current.

* * * * *